(12) United States Patent
Yuan et al.

(10) Patent No.: US 11,133,079 B2
(45) Date of Patent: Sep. 28, 2021

(54) SHIFT REGISTER UNIT AND GATE DRIVE CIRCUIT

(71) Applicants: Hefei Xinsheng Optoelectronics Technology Co., Ltd., Hefei (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN); Meng Li, Beijing (CN); Xuelian Cheng, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/504,652

(22) Filed: Jul. 8, 2019

(65) Prior Publication Data

US 2020/0035315 A1 Jan. 30, 2020

(30) Foreign Application Priority Data

Jul. 27, 2018 (CN) .......................... 201810846834.2

(51) Int. Cl.
*G11C 19/00* (2006.01)
*G11C 19/28* (2006.01)
(Continued)

(52) U.S. Cl.
CPC .............. *G11C 19/28* (2013.01); *G09G 3/20* (2013.01); *G09G 3/3677* (2013.01);
(Continued)

(58) Field of Classification Search
None
See application file for complete search history.

(56) References Cited

U.S. PATENT DOCUMENTS 8,023,610 B2 * 9/2011 Miyayama ............. G11C 19/28
377/64
8,605,027 B2 * 12/2013 Pak ....................... G09G 3/3677
345/100

(Continued)

FOREIGN PATENT DOCUMENTS

CN 101221818 7/2008
CN 101377956 3/2009

(Continued)

OTHER PUBLICATIONS

1st Office Action dated Apr. 23, 2020 for Chinese Patent Application No. 201810846834.2.

*Primary Examiner* — Tuan T Lam
(74) *Attorney, Agent, or Firm* — Thomas | Horstemeyer, LLP (57) ABSTRACT

A shift register unit includes an input module, a first output module, a first pull-down module, a reset module, and a leakage-proof module. The input module is coupled to a pull-up node, a control signal terminal, and an input signal terminal. The first output module is coupled to the pull-up node, a first output terminal, and a second clock signal terminal. The first pull-down module is coupled to the first output terminal, a first signal terminal, and a first clock signal terminal. The reset module is coupled to a reset signal terminal, the pull-up node, and the first output terminal. The leakage-proof module is coupled to a second signal terminal, the first node, and the pull-up node.

16 Claims, 5 Drawing Sheets

(51) Int. Cl.
*G09G 3/20* (2006.01)
*G09G 3/36* (2006.01)

(52) U.S. Cl.
CPC ... *G11C 19/287* (2013.01); *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 9,368,230 | B2* | 6/2016 | Yao | G11C 19/188 |
| 10,679,564 | B2* | 6/2020 | Jang | G09G 3/3674 |
| 10,810,920 | B2* | 10/2020 | Jang | G11C 19/287 |
| 2008/0002805 | A1* | 1/2008 | Tobita | G11C 19/28 377/64 |
| 2008/0101529 | A1* | 5/2008 | Tobita | G11C 19/28 377/64 |
| 2008/0219401 | A1* | 9/2008 | Tobita | G11C 19/28 377/79 |
| 2010/0177082 | A1* | 7/2010 | Joo | G09G 3/3677 345/211 |
| 2011/0058640 | A1* | 3/2011 | Shang | G11C 19/184 377/64 |
| 2011/0274234 | A1* | 11/2011 | Sakamoto | H01L 27/12 377/64 |
| 2014/0093028 | A1* | 4/2014 | Wu | G11C 19/28 377/64 |
| 2014/0354655 | A1* | 12/2014 | Kim | G11C 19/28 345/501 |
| 2016/0253976 | A1* | 9/2016 | Jang | G09G 3/3677 345/208 |
| 2016/0267854 | A1* | 9/2016 | Kim | G09G 3/3466 |
| 2017/0138256 | A1* | 5/2017 | Lavender | F02B 77/11 |
| 2018/0190231 | A1* | 7/2018 | Shi | H01L 29/78603 |
| 2020/0051656 | A1* | 2/2020 | Feng | G09G 3/3266 |
| 2020/0168162 | A1* | 5/2020 | Feng | G09G 3/3266 |

FOREIGN PATENT DOCUMENTS

| | | |
|---|---|---|
| CN | 104732950 | 6/2015 |
| CN | 106486049 | 3/2017 |
| CN | 108281123 | 7/2018 |
| KR | 20100083370 | 7/2010 |
| KR | 20160135456 | 11/2016 |

* cited by examiner

FIG. 9

SHIFT REGISTER UNIT AND GATE DRIVE CIRCUIT

CROSS-REFERENCE TO RELATED APPLICATION

This application is based upon, and claims the benefit of and priority to, Chinese Patent Application No. 201810846834.2, filed on Jul. 27, 2018, the entire contents thereof being incorporated herein by reference.

TECHNICAL FIELD

The present disclosure generally relates to the field of display technologies and, more particularly, to a shift register unit and a gate drive circuit.

BACKGROUND

In the field of display technologies, gate drive circuits are generally employed to transmit gate drive signals to pixel units of display regions row by row, thereby implementing an objective of receiving data signals by the pixel units row by row. The gate drive circuit generally includes a plurality of shift register units coupled in multiple stages. An output terminal of each shift register unit is coupled to a row of pixel units to transmit the gate drive signal to the pixel units.

In the related art, the shift register unit generally includes an input module, an output module, a pull-down unit, an inverter, and a reset module. The reset module and the pull-down module generally are composed of transistors, which are generally coupled between the pull-up node and a low level terminal.

However, in the related art, the above transistors are prone to threshold drift in a long-term bias operating environment. In a pull-up phase of a shift register, transistors with threshold drift may cause conduction between drains and sources, thereby leading to electric leakage of the pull-up nod.

It is to be noted that the above information disclosed in this Background section is only for enhancement of understanding of the background of the present disclosure, and thus, it may include information that does not constitute the prior art already known to those of ordinary skill in the art.

SUMMARY

An objective of the present disclosure is to provide a shift register unit and a gate drive circuit.

Other features and advantages of the present disclosure will become apparent from the following detailed description, or will be obtained, in part, by practice of the present disclosure.

According to an aspect of the present disclosure, there is provided a shift register unit, which includes an input module, a first output module, a first pull-down module, a reset module, and a leakage-proof module. The input module is coupled to a pull-up node, a control signal terminal, and an input signal terminal, and is configured to transmit a signal from the input signal terminal to the pull-up node in response to a signal from the control signal terminal. The first output module is coupled to the pull-up node, a first output terminal, and a second clock signal terminal, and is configured to transmit a signal from the second clock signal terminal to the first output terminal in response to a signal from the pull-up node. The first pull-down module is coupled to the first output terminal, a first signal terminal, and a first clock signal terminal, and is configured to transmit a signal from the first signal terminal to the first output terminal in response to a signal from the first clock signal terminal. The reset module is coupled to a reset signal terminal, the pull-up node, the first output terminal, and a first node, and is configured to transmit the signal from the first signal terminal to the first node in response to a reset signal from the reset signal terminal, transmit a signal from the first node to the pull-up node in response to the reset signal from the reset signal terminal, and transmit the signal from the first signal terminal to the first output terminal in response to the reset signal from the reset signal terminal. The leakage-proof module is coupled to a second signal terminal, the first node, and the pull-up node, and is configured to transmit a signal from the second signal terminal to the first node in response to the signal from the pull-up node.

In an exemplary embodiment of the present disclosure, the shift register unit further includes a second output module. The second output module is coupled to the pull-up node, a second output terminal, and the second clock signal terminal, and is configured to transmit the signal from the second clock signal terminal to the second output terminal in response to the signal from the pull-up node.

In an exemplary embodiment of the present disclosure, the shift register unit further includes a second pull-down module. The second pull-down module is coupled to the second output terminal, the first signal terminal, and the first clock signal terminal, and is configured to transmit the signal from the first signal terminal to the second output terminal in response to the signal from the first clock signal terminal.

In an exemplary embodiment of the present disclosure, the shift register unit further includes a noise reduction module. The noise reduction module is coupled to the pull-up node, a third clock signal terminal, the first signal terminal, the second output terminal, the first clock signal terminal, and the first node, and is configured to transmit the signal from the first signal terminal to the second output terminal in response to a signal from the third clock signal terminal, transmit the signal from the first signal terminal to the first node in response to the signal from the first clock signal terminal, and transmit the signal from the first node to the pull-up node in response to the signal from the third clock signal terminal.

In an exemplary embodiment of the present disclosure, the input module includes a first transistor and a second transistor. A first terminal of the first transistor is coupled to the input signal terminal, and a control terminal of the first transistor is coupled to the control signal terminal. A first terminal of the second transistor is coupled to a second terminal of the first transistor, a second terminal of the second transistor is coupled to the pull-up node, and a control terminal of the second transistor is coupled to the control signal terminal.

In an exemplary embodiment of the present disclosure, the first output module includes a third transistor and a storage capacitor. A first terminal of the third transistor is coupled to the second clock signal terminal, a second terminal of the third transistor is coupled to the first output terminal, and a control terminal of the third transistor is coupled to the pull-up node. An end of the storage capacitor is coupled to the pull-up node, and another end of the storage capacitor is coupled to the second terminal of the third transistor.

In an exemplary embodiment of the present disclosure, the second output module includes a fourth transistor. A first terminal of the fourth transistor is coupled to the second clock signal terminal, a second terminal of the fourth transistor is coupled to the second output terminal, and a control terminal of the fourth transistor is coupled to the pull-up node.

In an exemplary embodiment of the present disclosure, the first pull-down module includes a fifth transistor. A first terminal of the fifth transistor is coupled to the first signal terminal, a second terminal of the fifth transistor is coupled to the first output terminal, and a control terminal of the fifth transistor is coupled to the reset signal terminal.

In an exemplary embodiment of the present disclosure, the second pull-down unit includes a sixth transistor. A first terminal of the sixth transistor is coupled to the first signal terminal, a second terminal of the sixth transistor is coupled to the second output terminal, and a control terminal of the sixth transistor is coupled to the first clock signal terminal.

In an exemplary embodiment of the present disclosure, the reset module includes a seventh transistor, an eighth transistor, and a thirteenth transistor. A first terminal of the seventh transistor is coupled to the first signal terminal, a second terminal of the seventh transistor is coupled to the first output terminal, and a control terminal of the seventh transistor is coupled to the reset signal terminal. A first terminal of the eighth transistor is coupled to the pull-up node, a second terminal of the eighth transistor is coupled to the first node, and a control terminal of the eighth transistor is coupled to the reset signal terminal. A control terminal of the thirteenth transistor is coupled to the reset signal terminal, a first terminal of the thirteenth transistor is coupled to the first signal terminal, and a second terminal of the thirteenth transistor is coupled to the first node.

In an exemplary embodiment of the present disclosure, the leakage-proof module includes a ninth transistor. A first terminal of the ninth transistor is coupled to the second signal terminal, a second terminal of the ninth transistor is coupled to the first node, and a control terminal of the ninth transistor is coupled to the pull-up node.

In an exemplary embodiment of the present disclosure, the noise reduction module includes a tenth transistor, an eleventh transistor, and a twelfth transistor. A first terminal of the tenth transistor is coupled to the first signal terminal, a second terminal of the tenth transistor is coupled to the first node, and a control terminal of the tenth transistor is coupled to the first clock signal terminal. A first terminal of the eleventh transistor is coupled to the first signal terminal, a second terminal of the eleventh transistor is coupled to the second output terminal, and a control terminal of the eleventh transistor is coupled to the third clock signal terminal. A first terminal of the twelfth transistor is coupled to the first node, a second terminal of the twelfth transistor is coupled to the pull-up node, and a control terminal of the twelfth transistor is coupled to the third clock signal terminal.

The present disclosure also provides a gate drive circuit, which includes: the shift register unit of n stages according to one or more embodiments described above, a first clock signal line, a second clock signal line, a third clock signal line, a fourth clock signal line, and a fifth clock signal line. The first clock signal line is coupled to a first clock signal terminal of the shift register unit of odd-numbered stages, and is coupled to a second clock signal terminal of the shift register unit of even-numbered stages. The second clock signal line is coupled to a second clock signal terminal of the shift register unit of the odd-numbered stages, and is coupled to a first clock signal terminal of the shift register unit of the even-numbered stages. The third clock signal line is coupled to a third clock signal terminal of the shift register unit of the $(1+6m)^{th}$ stage and the $(2+6m)^{th}$ stage. The fourth clock signal line is coupled to a third clock signal terminal of the shift register unit of the $(3+6m)^{th}$ stage and the $(4+6m)^{th}$ stage. The fifth clock signal line is coupled to a third clock signal terminal of the shift register unit of the $(5+6m)^{th}$ stage and the $(6+6m)^{th}$ stage. The n is a positive integer greater than or equal to 1, and the m is a positive integer greater than 0.

It is to be understood that both the foregoing general description and the following detailed description are exemplary and explanatory only, and are not restrictive of the present disclosure.

BRIEF DESCRIPTION OF THE DRAWINGS

The accompanying drawings herein are incorporated in and constitute a part of this specification, and illustrate embodiments of the present disclosure and, together with the description, serve to explain the principles of the present disclosure. Understandably, the accompanying drawings in the following description show merely some embodiments of the present disclosure, and persons of ordinary skill in the art may still derive other drawings from these accompanying drawings without creative effort.

DETAILED DESCRIPTION

The exemplary embodiment will now be described more fully with reference to the accompanying drawings. However, the exemplary embodiments can be implemented in a variety of forms and should not be construed as limited to the embodiments set forth herein. Rather, the embodiments are provided so that the present disclosure will be thorough and complete, and will fully convey the concepts of exemplary embodiments to those skilled in the art. Throughout the drawings, similar reference signs indicate the same or similar structures, and their detailed description will be omitted.

Although this specification uses relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". Other relative terms such as "high", "low", "top", "bottom", "left", "right", and so on also have similar meanings. When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a", and "the" are intended to mean that there exists one or more elements/constituent parts/etc. The terms "comprising" and "having" are intended to be inclusive and mean that there may be additional elements/constituent parts/etc. other than the listed elements/constituent parts/etc.

Figure 1:
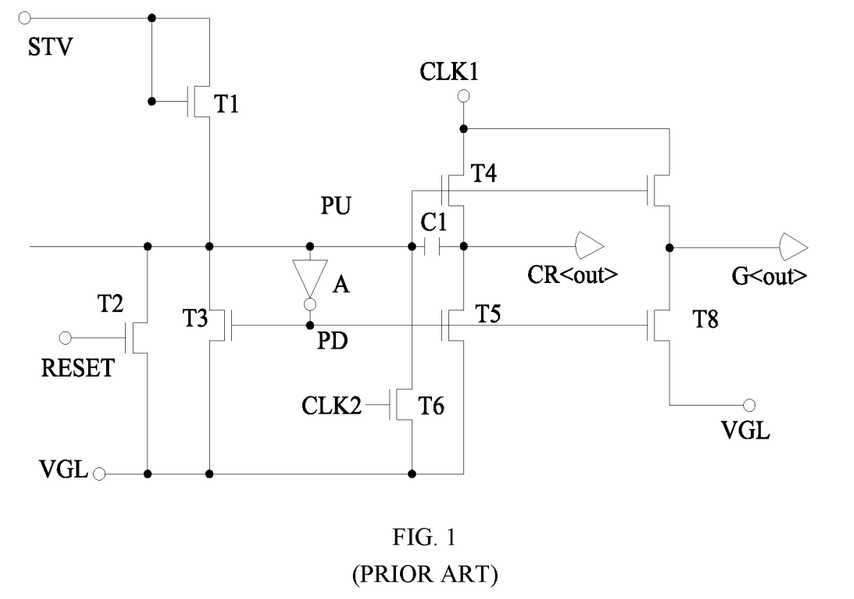
FIG. 1 is a schematic structural diagram of a shift register in the related art.
Figure 2:
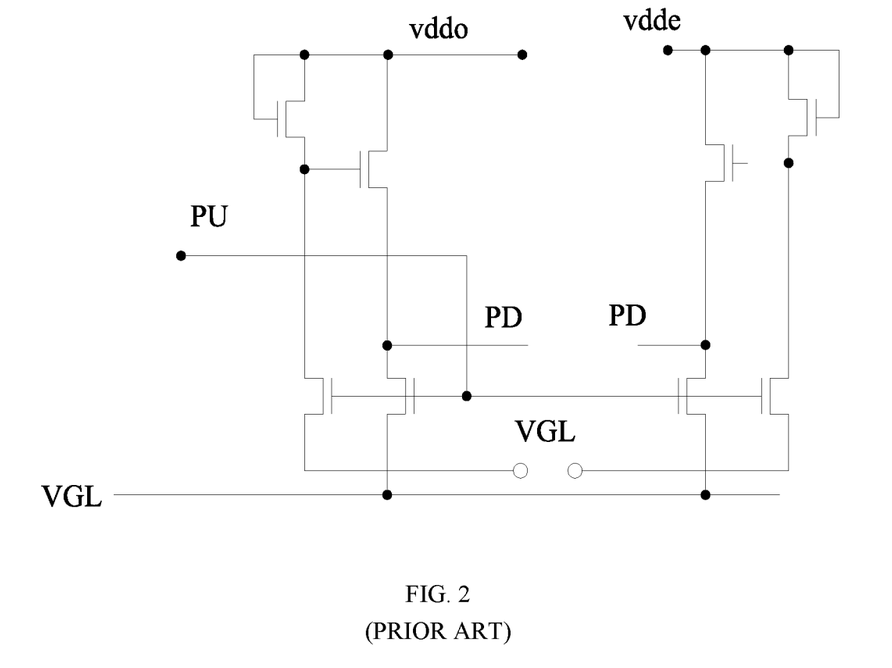
FIG. 2 is a schematic structural diagram of an inverter of the shift register in the related art.

As shown in FIG. 1, a schematic structural diagram of a shift register in the related art is illustrated. In the related art, the shift register includes a reset module, a pull-down module, an inverter A, an input module, an output module, and a noise reduction module. The reset module includes a transistor T2. The pull-down module includes transistors T3, T5, and T8. The input module includes a transistor T1. The output module includes a charging capacitor C1 and a transistor T4. The noise reduction module includes a transistor T6. The structure of the inverter A may be as shown in FIG. 2, which is a schematic structural diagram of an inverter of a shift register in the related art. The inverter is coupled between a pull-up node PU and a pull-down node PD. A control terminal of the transistor T2 is coupled to a reset signal RESET, a first terminal of the transistor T2 is coupled to the pull-up node PU, and a second terminal of the transistor T2 is coupled to a low level terminal VGL. A control terminal of the transistor T3 is coupled to the pull-down node PD, and a second terminal of the transistor T3 is coupled to the low level terminal VGL. However, if the transistors T2 and T3 operate for a long time under bias conditions, the thresholds of the transistors T2 and T3 may drift. In a pull-up phase of the shift register, the transistors T2 and T3 may likely be enabled under the action of the voltage between the pull-up node PU and the low level terminal VGL, which causes electric leakage of the pull-up node PU. Meanwhile, in the related art, the structure of the shift register is relatively complicated, and thus, the shift register is not easy to be integrated inside or outside the display panel.

Figure 3:
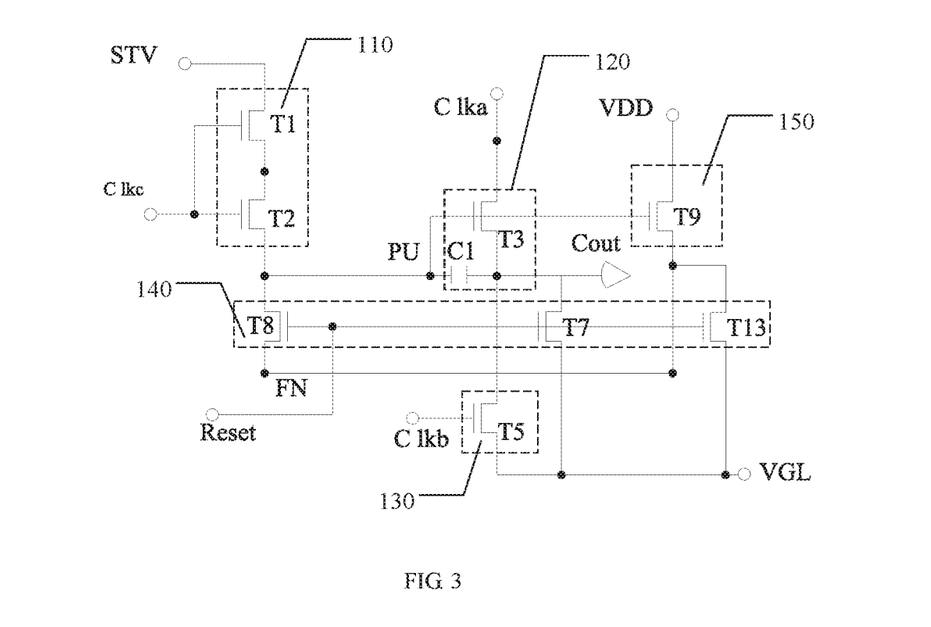
FIG. 3 is a schematic structural diagram of a shift register unit according to an exemplary embodiment of the present disclosure.

On this basis, this exemplary embodiment provides a shift register unit. As shown in FIG. 3, a schematic structural diagram of a shift register unit according to an exemplary embodiment of the present disclosure is illustrated. The shift register unit includes an input module 110, a first output module 120, a first pull-down module 130, a reset module 140, and a leakage-proof module 150. The input module 110 is coupled to a pull-up node PU, a control signal terminal Clkc, and an input signal terminal STV, and is configured to transmit a signal from the input signal terminal STV to the pull-up node PU in response to a signal from the control signal terminal Clkc. The first output module 120 is coupled to the pull-up node PU, a first output terminal Cout, and a second clock signal terminal Clka, and is configured to transmit a signal from the second clock signal terminal Clka to the first output terminal Cout in response to a signal from the pull-up node PU. The first pull-down module 130 is coupled to the first output terminal Cout, a first signal terminal VGL, and a first clock signal terminal Clkb, and is configured to transmit a signal from the first signal terminal VGL to the first output terminal Cout in response to a signal from the first clock signal terminal Clkb. The reset module 140 is coupled to a reset signal terminal Reset, the pull-up node PU, the first output terminal Cout, and a first node FN, and is configured to transmit the signal from the first signal terminal VGL to the first node FN in response to a reset signal from the reset signal terminal Reset, transmit a signal from the first node FN to the pull-up node PU in response to the reset signal from the reset signal terminal Reset, and transmit the signal from the first signal terminal VGL to the first output terminal Cout in response to the reset signal from the reset signal terminal Reset. The leakage-proof module 150 is coupled to the second signal terminal VDD, the first node FN, and the pull-up node PU, and is configured to transmit a signal from the second signal terminal VDD to the first node FN in response to the signal from the pull-up node PU.

This exemplary embodiment provides a shift register unit and a gate drive circuit. The shift register unit includes an input module, a first output module, a first pull-down module, a reset module, and a leakage-proof module. The input module is coupled to a pull-up node, a control signal terminal, and an input signal terminal. The first output module is coupled to the pull-up node, a first output terminal, and a second clock signal terminal. The first pull-down module is coupled to the first output terminal, a first signal terminal, and a first clock signal terminal. The reset module is coupled to a reset signal terminal, the pull-up node, and the first output terminal. The leakage-proof module is coupled to a second signal terminal, the first node, and the pull-up node. In one aspect, the leakage-proof module of the present disclosure may input a high level to the first node in a pull-up phase of a shift register, thereby preventing electric charges on the pull-up node from being leaked to the first node. In another aspect, the shift register unit provided by the present disclosure is simple in structure, and is convenient to be integrated inside or outside a display panel.

In this exemplary embodiment, as shown in FIG. 3, the input module 110 may include a first transistor T1 and a second transistor T2. A first terminal of the first transistor T1 is coupled to the input signal terminal STV, and a control terminal of the first transistor T1 is coupled to the control signal terminal Clkc. A first terminal of the second transistor T2 is coupled to a second terminal of the first transistor T1, a second terminal of the second transistor T2 is coupled to the pull-up node PU, and a control terminal of the second transistor T2 is coupled to the control signal terminal Clkc. In this exemplary embodiment, the control signal terminal Clkc also may share the signal from the first clock signal terminal Clkb. It is to be understood that in other exemplary embodiments, the control signal terminal Clkc may share the same input signal as the input signal terminal STV. In this case, the input module 110 may include only one transistor T1 or T2, which falls within the protection scope of the present disclosure.

In this exemplary embodiment, as shown in FIG. 3, the first output module 120 may include a third transistor T3 and a storage capacitor C1. A first terminal of the third transistor T3 is coupled to the second clock signal terminal Clka, a second terminal of the third transistor T3 is coupled to the first output terminal Cout, and a control terminal of the third transistor T3 is coupled to the pull-up node PU. An end of the storage capacitor C1 is coupled to the pull-up node PU, and another end of the storage capacitor C1 is coupled to the second terminal of the third transistor T3. It is to be understood that in other exemplary embodiments, there are more manners for selecting the first output module which fall within the protection scope of the present disclosure.

In this exemplary embodiment, as shown in FIG. 3, the first pull-down module 130 may include a fifth transistor T5. A first terminal of the fifth transistor T5 is coupled to the first signal terminal Clkb, a second terminal of the fifth transistor T5 is coupled to the first output terminal Cout, and a control terminal of the fifth transistor T5 is coupled to the reset signal terminal Reset. It is to be understood that in other exemplary embodiments, there are more manners for selecting the pull-down module which fall within the protection scope of the present disclosure.

In this exemplary embodiment, as shown in FIG. 3, the reset module 140 may include a seventh transistor T7, an eighth transistor T8, and a thirteenth transistor T13. A first terminal of the seventh transistor T7 is coupled to the first signal terminal VG1, a second terminal of the seventh transistor T7 is coupled to the first output terminal Cout, and a control terminal of the seventh transistor T7 is coupled to the reset signal terminal Reset. A first terminal of the eighth transistor T8 is coupled to the pull-up node PU, a second terminal of the eighth transistor T8 is coupled to the first node FN, and a control terminal of the eighth transistor T8 is coupled to the reset signal terminal Reset. A control terminal of the thirteenth transistor T13 is coupled to the reset signal terminal Reset, a first terminal of the thirteenth transistor T13 is coupled to the first signal terminal VG1, and a second terminal of the thirteenth transistor T13 is coupled to the first node FN.

In this exemplary embodiment, as shown in FIG. 3, the leakage-proof module may include a ninth transistor T9. A first terminal of the ninth transistor T9 is coupled to the second signal terminal VDD, a second terminal of the ninth transistor T9 is coupled to the first node FN, and a control terminal of the ninth transistor T9 is coupled to the pull-up node PU. It is to be understood that in other exemplary embodiments, there are more manners for selecting the leakage-proof module which fall within the protection scope of the present disclosure.

In this exemplary embodiment, the transistors may be either P-type transistors or N-type transistors. In this exemplary embodiment, reference is made taking an example where the transistors are the N-type transistors.

Figure 4:
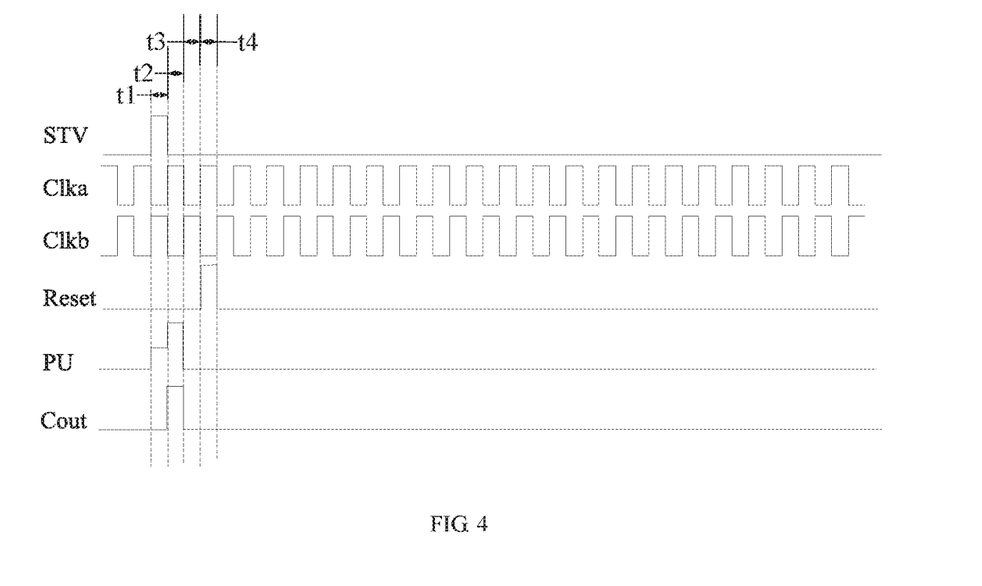
FIG. 4 is a timing sequence diagram of each signal in a shift register unit according to an exemplary embodiment of the present disclosure.

In this exemplary embodiment, as shown in FIG. 4, a timing sequence diagram of each signal in a shift register unit according to an exemplary embodiment of the present disclosure is illustrated. In addition, the second signal terminal VDD generally is at a high level, whereas the first signal terminal VGL generally is at a low level. The shift register unit includes four working phases: a charging phase (t1), a pull-up phase (t2), a pull-down phase (t3), and a reset phase (t4). The above-referenced four phases are described in detail below with reference to FIG. 4 and FIG. 3.

In the charging phase (t1), signals outputted from the input signal terminal STV, the second signal terminal VDD and the first clock signal terminal Clkb are high level signals, whereas signals outputted from the second clock signal terminal Clka and the first signal terminal VGL are low level signals. The first transistor T1 and the second transistor T2 are enabled, the input signal terminal STV charges the charging capacitor C1, and the pull-up node PU holds at a high level state. The fifth transistor T5 is enabled by the first clock signal terminal Clkb, and the first output terminal Cout is at a low level.

In the pull-up phase (t2), signals outputted from the second clock signal terminal Clka and the second signal terminal VDD are high level signals, whereas signals outputted from the input signal terminal STV, the first clock signal terminal Clkb and the first signal terminal VGL are low level signals. The third transistor T3 is enabled under the action of the high level of the pull-up node PU, and the first output terminal Cout becomes a high level under the action of the second clock signal terminal Clka. Due to the bootstrapping effect of the charging capacitor C1, the voltage of the pull-up node PU is increased. The ninth transistor T9 is enabled by the pull-up node, and the first node FN is at a high level under the action of the second signal terminal VDD, thereby preventing electric charges on the pull-up node PU from being leaked through the eighth transistor T8.

In the pull-down phase (t3), signals outputted from the second signal terminal VDD and the first clock signal terminal Clkb are high level signals, whereas signals outputted by the reset signal terminal Reset, the second clock signal terminal Clka and the first signal terminal VGL are low level signals. The fifth transistor T5 is enabled under the action of the signal outputted from the first clock signal terminal Clkb, and the first output terminal Cout outputs a low level signal.

In the reset phase (t4), signals outputted from the reset signal terminal Reset, the second signal terminal VDD, and the second clock signal terminal Clka are high level signals, whereas signals outputted from the first clock signal terminal Clkb and the first signal terminal VGL are low level signals. The seventh transistor T7, the eighth transistor T8, and the thirteenth transistor T13 are enabled by the reset signal terminal, and the pull-up node PU and the first output terminal Cout are at a low level.

Figure 5:
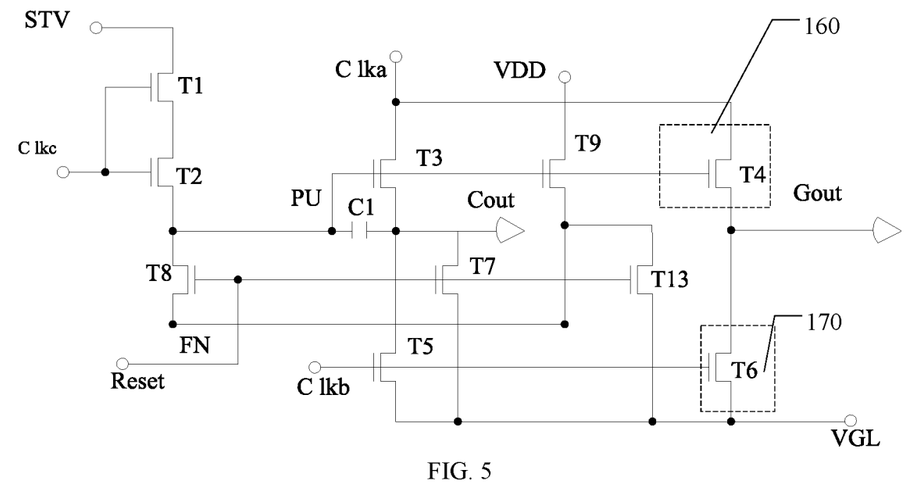
FIG. 5 is a schematic structural diagram of a shift register unit according to another exemplary embodiment of the present disclosure.

In this exemplary embodiment, as shown in FIG. 5, a schematic structural diagram of a shift register unit according to still another exemplary embodiment of the present disclosure is illustrated. The shift register unit may further include a second output module 160. The second output module 160 is coupled to the pull-up node PU, a second output terminal Gout, and the second clock signal terminal Clka, and is configured to transmit the signal from the second clock signal terminal Clka to the second output terminal Gout in response to the signal from the pull-up node PU. The second output terminal Gout has the same output signal as the first output terminal Cout, and the second output terminal Gout may serve as the input signal terminal of a next shift register unit of a certain stage and the reset signal terminal of a previous shift register unit of a certain stage. The first output signal terminal Cout may serve as a gate drive signal outputted from the shift register unit of the current stage.

In this exemplary embodiment, as shown in FIG. 5, the shift register unit may further include a second pull-down module 170. The second pull-down module is coupled to the second output terminal Gout, the first signal terminal VG1, and the first clock signal terminal Clkb, and is configured to transmit the signal from the first signal terminal VG1 to the second output terminal Gout in response to the signal from the first clock signal terminal Clkb. The second pull-down module is configured to transmit the signal from the first signal terminal VG1 to the second output terminal Gout in the charging phase and the pull-down phase of the shift register unit, thereby performing a pull-down control on the second output terminal Gout.

In this exemplary embodiment, as shown in FIG. 5, the second output module may include a fourth transistor T4. A first terminal of the fourth transistor T4 is coupled to the second clock signal terminal Clka, a second terminal of the fourth transistor T4 is coupled to the second output terminal Gout, and a control terminal of the fourth transistor T4 is coupled to the pull-up node PU. The second pull-down unit may include a sixth transistor T6. A first terminal of the sixth transistor T6 is coupled to the first signal terminal VG1, a second terminal of the sixth transistor T6 is coupled to the second output terminal Gout, and a control terminal of the sixth transistor T6 is coupled to the first clock signal terminal Clkb. It is to be understood that, in other exemplary embodiments, the second output module and the second pull-down module may also have other structures which fall within the protection scope of the present disclosure.

Figure 6:
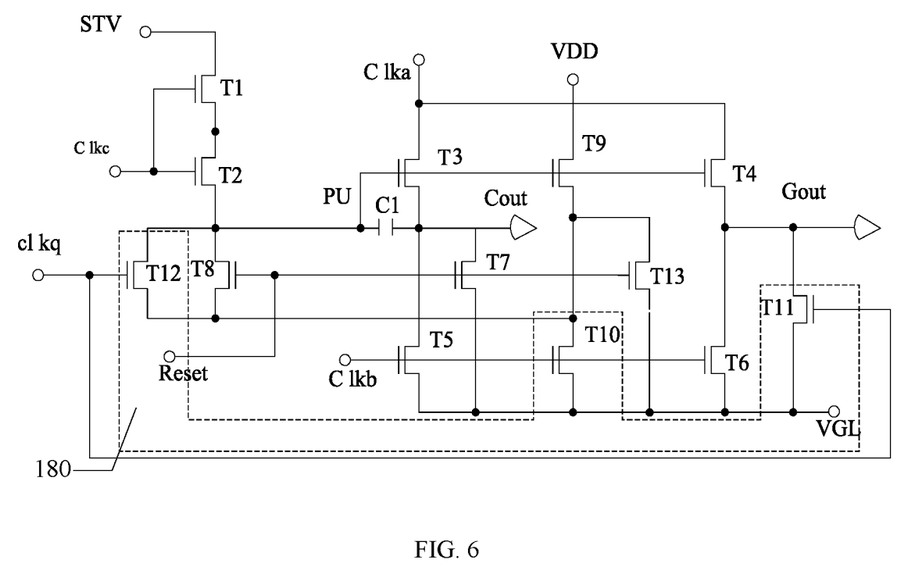
FIG. 6 is a schematic structural diagram of a shift register unit according to still another exemplary embodiment of the present disclosure.

In this exemplary embodiment, as shown in FIG. 6, a schematic structural diagram of a shift register unit according to still another exemplary embodiment of the present disclosure is illustrated. The shift register unit further includes a noise reduction module 180. The noise reduction module is coupled to the pull-up node PU, a third clock signal terminal Clkq, the first signal terminal VG1, the second output terminal Gout, the first clock signal terminal Clkb, and the first node FN, and is configured to transmit the signal from the first signal terminal VG1 to the second output terminal Gout in response to a signal from the third clock signal terminal Clkq, transmit the signal from the first signal terminal VG1 to the first node FN in response to the signal from the first clock signal terminal Clkb, and transmit the signal from the first node FN to the pull-up node PU in response to the signal from the third clock signal terminal Clkq. In a time phase other than the charging phase and the pull-up phase of the shift register unit, the noise reduction module may perform noise reduction on the second output terminal Gout and the pull-up node PU in combination with the first clock signal.

In this exemplary embodiment, the noise reduction module may include a tenth transistor T10, an eleventh transistor T11, and a twelfth transistor T12. A first terminal of the tenth transistor T10 is coupled to the first signal terminal VGL, a second terminal of the tenth transistor T10 is coupled to the first node FN, and a control terminal of the tenth transistor T10 is coupled to the first clock signal terminal. A first terminal of the eleventh transistor T11 is coupled to the first signal terminal VG1, a second terminal of the eleventh transistor T11 is coupled to the second output terminal Gout, and a control terminal of the eleventh transistor T11 is coupled to the third clock signal terminal. A first terminal of the twelfth transistor T12 is coupled to the first node FN, a second terminal of the twelfth transistor T12 is coupled to the pull-up node PU, and a control terminal of the twelfth transistor T12 is coupled to the third clock signal terminal Clkq. Meanwhile, in the pull-up phase, the leakage-proof module 150 also may prevent the pull-up node from electric leakage through the twelfth transistor T12.

Figure 7:
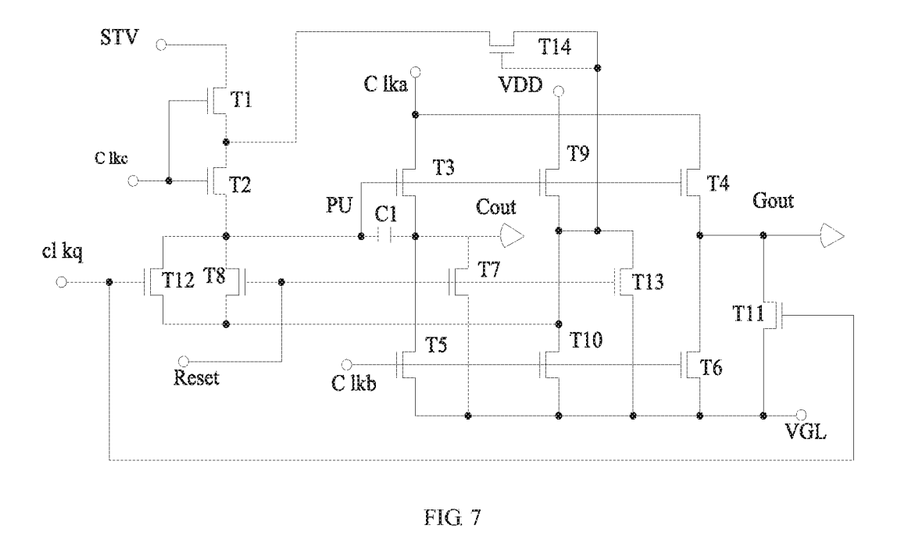
FIG. 7 is a schematic structural diagram of a shift register unit according to still another exemplary embodiment of the present disclosure.

In this exemplary embodiment, in the pull-up phase, the input signal terminal STV is at a low level, the pull-up node PU is at a high level, and the electric charges on the pull-up node PU may be leaked to the input signal terminal STV through the first transistor T1 and the second transistor T2. As shown in FIG. 7, a schematic structural diagram of a shift register unit according to still another exemplary embodiment of the present disclosure is illustrated. In this exemplary embodiment, the second terminal of the first transistor T1 may be coupled to the first node. In the pull-up phase, the pull-up node PU is at a high level, the ninth transistor T9 is enabled, and the second terminal of the first transistor T1 is at a high level under the action of the second signal terminal VDD, thereby preventing the electric charges on the pull-up node PU from being leaked to the input signal terminal STV through the first transistor T1 and the second transistor T2. However, when the second terminal of the first transistor T1 is coupled to the first node, the high level signal outputted from the input signal terminal STV may leak electric charges to the first signal terminal VSS through the tenth transistor T10 when the input signal terminal STV charges the pull-up node in the charging phase. Therefore, a fourteenth transistor T14 may be coupled between the second terminal of the first transistor T1 and the first node. A control terminal of the fourteenth transistor T14 is coupled to the second terminal of the tenth transistor T10, a first terminal of the fourteenth transistor T14 is coupled to the second terminal of the tenth transistor T10, and a second terminal of the fourteenth transistor T14 is coupled to the second terminal of the first transistor. The tenth transistor T10 is enabled when the second terminal of the tenth transistor T10 is at a high level, and the tenth transistor T10 is disabled when the second terminal of the tenth transistor T10 is at a low level. Thus, it may be prevented that the high level signal outputted from the input signal terminal STV may leak electric charges to the first signal terminal VSS through the tenth transistor T10.

Figure 8:
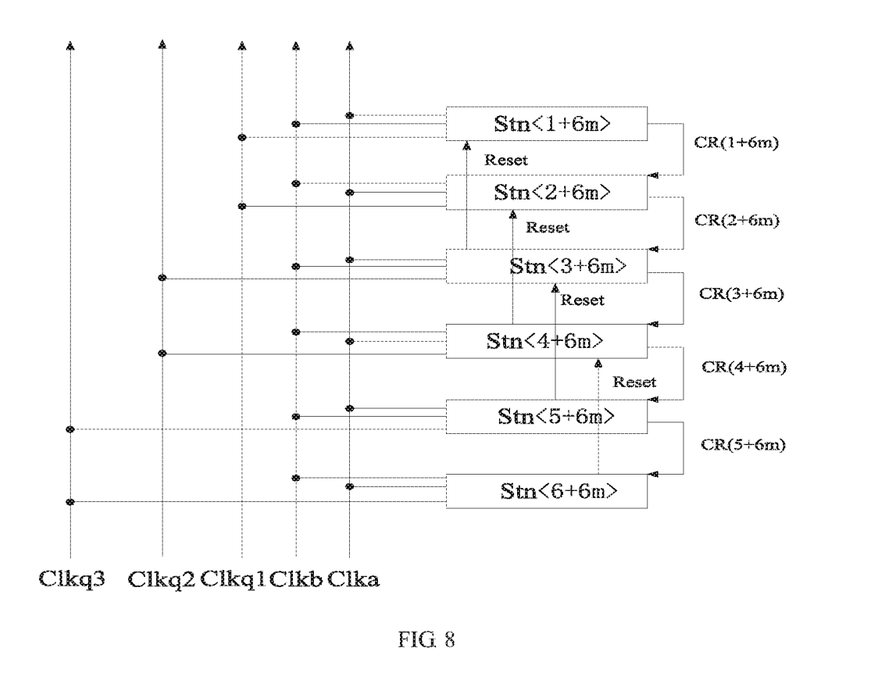
FIG. 8 is a schematic structural diagram of a gate drive circuit according to an exemplary embodiment of the present disclosure.

This exemplary embodiment also provides a gate drive circuit, as shown in FIG. 8, a schematic structural diagram of a gate drive circuit according to an exemplary embodiment of the present disclosure is illustrated. The gate drive circuit includes: the shift register unit Stn(n) of n stages according to any one of the embodiments described herein, a first clock signal line Clkb, a second clock signal line Clka, a third clock signal line Clkq1, a fourth clock signal line Clkq2, and a fifth clock signal line Clkq3. The first clock signal line is coupled to a first clock signal terminal Clkb of the shift register unit of odd-numbered stages, and is coupled to a second clock signal terminal Clka of the shift register unit of even-numbered stages. The second clock signal line Clka is coupled to a second clock signal terminal Clka of the shift register unit of the odd-numbered stages and is coupled to a first clock signal terminal Clkb of the shift register unit of the even-numbered stages. The third clock signal line is coupled to a third clock signal terminal of the shift register unit of the $(1+6m)^{th}$ stage and the $(2+6m)^{th}$ stage. The fourth clock signal line is coupled to a third clock signal terminal of the shift register unit of the $(3+6m)^{th}$ stage and the $(4+6m)^{th}$ stage. The fifth clock signal line is coupled to a third clock signal terminal of the shift register unit of the $(5+6m)^{th}$ stage and the $(6+6m)^{th}$ stage. The n is a positive integer greater than or equal to 1, and the m is a positive integer greater than 0.

Figure 9:
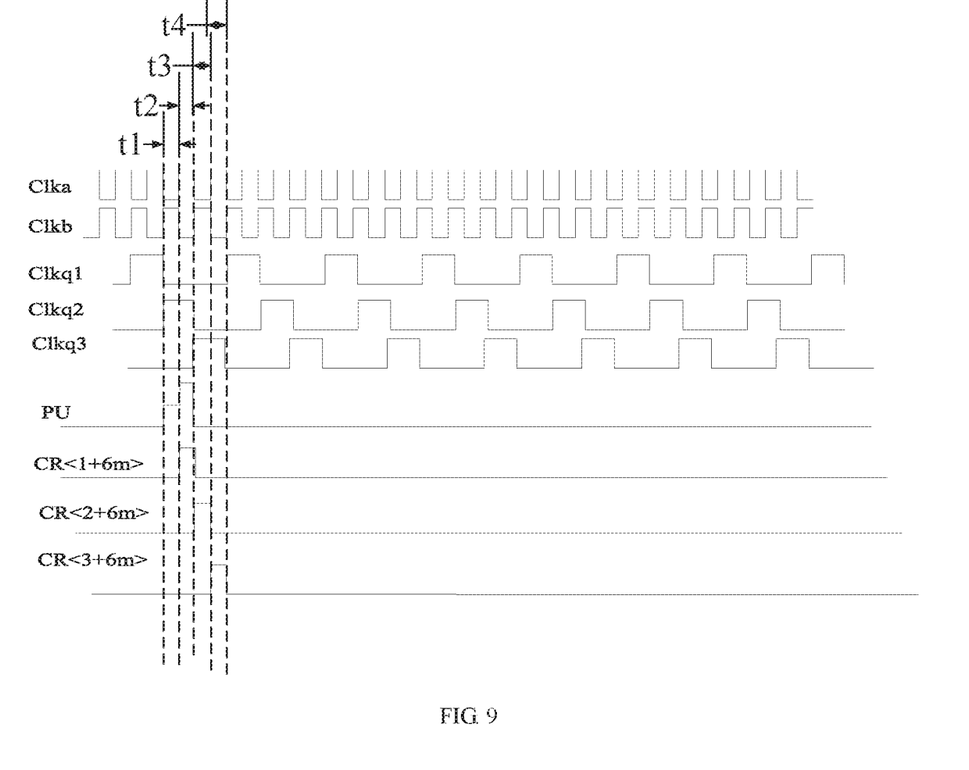
FIG. 9 is a timing sequence diagram of a signal on each drive line of a gate drive circuit according to an exemplary embodiment of the present disclosure.

As shown in FIG. 9, a timing sequence diagram of a signal on each drive line of the gate drive circuit according to the present disclosure is illustrated. The first clock signal is equal to the second clock signal in cycle, but is opposite to the second clock signal in polarity, and a duty ratio of the first clock signal and a duty ratio of the second clock signal both are ½. The cycle of the third clock signal is triple that of the first clock signal, the duty ratio of the third clock signal is ⅓, and a rising edge of the third clock signal corresponds to that of the first clock signal. The fourth clock signal has the same cycle and the same duty ratio as the third clock signal, and the rising edge of the fourth clock signal corresponds to a falling edge of the third clock signal. The fifth clock signal has the same cycle and the same duty ratio as the fourth clock signal, and the rising edge of the fifth clock signal corresponds to the falling edge of the fourth clock signal. The time phases t1, t2, t3, and t4 are the charging phase, the pull-up phase, the pull-down phase and the reset phase of the shift register unit Stn (1+6m), respectively. In the time phase t2, the high level signal CR(1+6m) outputted from the second output terminal Gout of the shift register unit Stn(1+6m) may serve as the input signal of the shift register unit Stn (2+6m). Similarly, the signal CR(N)

outputted from the second signal output terminal of the shift register unit Stn(N) may serve as the input signal of the shift register unit Stn(N+1), where N is an integer greater than or equal to 1. The time phase t4 is the pull-up phase of the shift register unit Stn (3+6m). In this phase, a high level signal outputted from the second output terminal Gout of the shift register unit Stn (3+6m) may serve as the reset signal of the shift register unit Stn(1+6m). Similarly, the output signal outputted from the second output terminal of the shift register unit Stn(N+2) may serve as the input signal of the shift register unit Stn(N), where N is an integer greater than or equal to 1. As can be seen from FIG. 9, in the time phases t1, t2, and t3, the third clock signal line Clkq1 coupled to the shift register units Stn (1+6m) and Stn (2+6m) is at a low level. In this case, the three clock signal line Clkq1 has no negative effect on the charging and pull-up operations of the shift register units Stn (1+6m) and Stn (2+6m). In the time phases t1 and t2, the fourth clock signal line Clkq2 coupled to the shift register units Stn (3+6m) and Stn (4+6m) is at a high level. As can be seen from FIG. 6, at this moment, the fourth clock signal line Clkq2 may pull the second output terminals Gout of the shift register units Stn(3+6m) and Stn (4+6m) and the pull-up node down to be a low level, thereby performing a noise reduction on the second output terminals Gout of the shift register units Stn(3+6m) and Stn (4+6m) and the pull-up node.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A shift register unit, comprising:
    an input module coupled to a pull-up node, a control signal terminal, and an input signal terminal, and configured to transmit a signal from the input signal terminal to the pull-up node in response to a signal from the control signal terminal;
    a first output module coupled to the pull-up node, a first output terminal, and a second clock signal terminal, and configured to transmit a signal from the second clock signal terminal to the first output terminal in response to a signal from the pull-up node;
    a first pull-down module coupled to the first output terminal, a first signal terminal, and a first clock signal terminal, and configured to transmit a signal from the first signal terminal to the first output terminal in response to a signal from the first clock signal terminal;
    a reset module coupled to a reset signal terminal, the pull-up node, the first output terminal, and a first node, and configured to transmit the signal from the first signal terminal to the first node in response to a reset signal from the reset signal terminal, transmit a signal from the first node to the pull-up node in response to the reset signal from the reset signal terminal, and transmit the signal from the first signal terminal to the first output terminal in response to the reset signal from the reset signal terminal;
    a leakage-proof module coupled to a second signal terminal, the first node, and the pull-up node, and configured to transmit a signal from the second signal terminal to the first node in response to the signal from the pull-up node;
    a second output module coupled to the pull-up node, a second output terminal, and the second clock signal terminal, and configured to transmit the signal from the second clock signal terminal to the second output terminal in response to the signal from the pull-up node;
    a second pull-down module coupled to the second output terminal, the first signal terminal, and the first clock signal terminal, and configured to transmit the signal from the first signal terminal to the second output terminal in response to the signal from the first clock signal terminal; and
    a noise reduction module coupled to the pull-up node, a third clock signal terminal, the first signal terminal, the second output terminal, the first clock signal terminal, and the first node, and configured to transmit the signal from the first signal terminal to the second output terminal in response to a signal from the third clock signal terminal, transmit the signal from the first signal terminal to the first node in response to the signal from the first clock signal terminal, and transmit the signal from the first node to the pull-up node in response to the signal from the third clock signal terminal.

2. The shift register unit according to claim 1, wherein the input module comprises:
    a first transistor, a first terminal of the first transistor being coupled to the input signal terminal, and a control terminal of the first transistor being coupled to the control signal terminal; and
    a second transistor, a first terminal of the second transistor being coupled to a second terminal of the first transistor, a second terminal of the second transistor being coupled to the pull-up node, and a control terminal of the second transistor being coupled to the control signal terminal.

3. The shift register unit according to claim 1, wherein:
    the first output module comprises:
        a third transistor, a first terminal of the third transistor being coupled to the second clock signal terminal, a second terminal of the third transistor being coupled to the first output terminal, and a control terminal of the third transistor being coupled to the pull-up node; and
        a storage capacitor, an end of the storage capacitor being coupled to the pull-up node, and another end of the storage capacitor being coupled to the second terminal of the third transistor;
    wherein the second output module comprises:
        a fourth transistor, a first terminal of the fourth transistor being coupled to the second clock signal terminal, a second terminal of the fourth transistor being coupled to the second output terminal, and a control terminal of the fourth transistor being coupled to the pull-up node.

4. The shift register unit according to claim 3, wherein:
    the first pull-down module comprises: a fifth transistor, a first terminal of the fifth transistor being coupled to the first signal terminal, a second terminal of the fifth transistor being coupled to the first output terminal, and a control terminal of the fifth transistor being coupled to the first clock signal terminal; and the second pull-down unit comprises: a sixth transistor, a first terminal of the sixth transistor being coupled to the first signal terminal, a second terminal of the sixth transistor being coupled to the second output terminal, and a control terminal of the sixth transistor being coupled to the first clock signal terminal.

5. The shift register unit according to claim 1, wherein the reset module comprises:
a seventh transistor, a first terminal of the seventh transistor being coupled to the first signal terminal, a second terminal of the seventh transistor being coupled to the first output terminal, and a control terminal of the seventh transistor being coupled to the reset signal terminal;
an eighth transistor, a first terminal of the eighth transistor being coupled to the pull-up node, a second terminal of the eighth transistor being coupled to the first node, and a control terminal of the eighth transistor being coupled to the reset signal terminal; and
a thirteenth transistor, a control terminal of the thirteenth transistor being coupled to the reset signal terminal, a first terminal of the thirteenth transistor being coupled to the first signal terminal, a second terminal of the thirteenth transistor being coupled to the first node.

6. The shift register unit according to claim 1, wherein the leakage-proof module comprises: a ninth transistor, a first terminal of the ninth transistor being coupled to the second signal terminal, a second terminal of the ninth transistor being coupled to the first node, and a control terminal of the ninth transistor being coupled to the pull-up node.

7. The shift register unit according claim 1, wherein the noise reduction module comprises:
a tenth transistor, a first terminal of the tenth transistor being coupled to the first signal terminal, a second terminal of the tenth transistor being coupled to the first node, and a control terminal of the tenth transistor being coupled to the first clock signal terminal;
an eleventh transistor, a first terminal of the eleventh transistor being coupled to the first signal terminal, a second terminal of the eleventh transistor being coupled to the second output terminal, and a control terminal of the eleventh transistor being coupled to the third clock signal terminal; and
a twelfth transistor, a first terminal of the twelfth transistor being coupled to the first node, a second terminal of the twelfth transistor being coupled to the pull-up node, and a control terminal of the twelfth transistor being coupled to the third clock signal terminal.

8. A gate drive circuit, comprising:
a shift register unit of n stages;
a first clock signal line coupled to a first clock signal terminal of the shift register unit of odd-numbered stages and coupled to a second clock signal terminal of the shift register unit of even-numbered stages;
a second clock signal line coupled to a second clock signal terminal of the shift register unit of odd-numbered stages and coupled to a first clock signal terminal of the shift register unit of even-numbered stages;
a third clock signal line, coupled to a third clock signal terminal of the shift register unit of the $(1+6m)^{th}$ stage and the $(2+6m)^{th}$ stage;
a fourth clock signal line, coupled to a third clock signal terminal of the shift register unit of the $(3+6m)^{th}$ stage and the $(4+6m)^{th}$ stage; and
a fifth clock signal line, coupled to a third clock signal terminal of the shift register unit of the $(5+6m)^{th}$ stage and the $(6+6m)^{th}$ stage, wherein:
the n is a positive integer greater than or equal to 1, and the m is a positive integer greater than 0; and
the shift register unit comprises:
an input module coupled to a pull-up node, a control signal terminal, and an input signal terminal, and configured to transmit a signal from the input signal terminal to the pull-up node in response to a signal from the control signal terminal;
a first output module coupled to the pull-up node, a first output terminal, and a second clock signal terminal, and configured to transmit a signal from the second clock signal terminal to the first output terminal in response to a signal from the pull-up node;
a first pull-down module coupled to the first output terminal, a first signal terminal, and a first clock signal terminal, and configured to transmit a signal from the first signal terminal to the first output terminal in response to a signal from the first clock signal terminal;
a reset module coupled to a reset signal terminal, the pull-up node, the first output terminal, and a first node, and configured to transmit the signal from the first signal terminal to the first node in response to a reset signal from the reset signal terminal, transmit a signal from the first node to the pull-up node in response to the reset signal from the reset signal terminal, and transmit the signal from the first signal terminal to the first output terminal in response to the reset signal from the reset signal terminal; and
a leakage-proof module coupled to a second signal terminal, the first node, and the pull-up node, and configured to transmit a signal from the second signal terminal to the first node in response to the signal from the pull-up node.

9. The gate drive circuit according to claim 8, wherein the shift register unit further comprises:
a second output module coupled to the pull-up node, a second output terminal, and the second clock signal terminal, and configured to transmit the signal from the second clock signal terminal to the second output terminal in response to the signal from the pull-up node; and
a second pull-down module coupled to the second output terminal, the first signal terminal, and the first clock signal terminal and configured to transmit the signal from the first signal terminal to the second output terminal in response to the signal from the first clock signal terminal.

10. The gate drive circuit according to claim 9, wherein the shift register unit further comprises:
a noise reduction module coupled to the pull-up node, a third clock signal terminal, the first signal terminal, the second output terminal, the first clock signal terminal, and the first node, and configured to transmit the signal from the first signal terminal to the second output terminal in response to a signal from the third clock signal terminal, transmit the signal from the first signal terminal to the first node in response to the signal from the first clock signal terminal, and transmit the signal from the first node to the pull-up node in response to the signal from the third clock signal terminal.

11. The gate drive circuit according to claim 8, wherein the input module comprises:
- a first transistor, a first terminal of the first transistor being coupled to the input signal terminal, and a control terminal of the first transistor being coupled to the control signal terminal; and
- a second transistor, a first terminal of the second transistor being coupled to a second terminal of the first transistor, a second terminal of the second transistor being coupled to the pull-up node, and a control terminal of the second transistor being coupled to the control signal terminal.

12. The gate drive circuit according to claim 9, wherein: the first output module comprises:
- a third transistor, a first terminal of the third transistor being coupled to the second clock signal terminal, a second terminal of the third transistor being coupled to the first output terminal, and a control terminal of the third transistor being coupled to the pull-up node; and
- a storage capacitor, an end of the storage capacitor being coupled to the pull-up node, and another end of the storage capacitor being coupled to the second terminal of the third transistor;

the second output module comprises:
- a fourth transistor, a first terminal of the fourth transistor being coupled to the second clock signal terminal, a second terminal of the fourth transistor being coupled to the second output terminal, and a control terminal of the fourth transistor being coupled to the pull-up node.

13. The gate drive circuit according to claim 12, wherein: the first pull-down module comprises:
- a fifth transistor, a first terminal of the fifth transistor being coupled to the first signal terminal, a second terminal of the fifth transistor being coupled to the first output terminal, and a control terminal of the fifth transistor being coupled to the first clock signal terminal;

the second pull-down unit comprises:
- a sixth transistor, a first terminal of the sixth transistor being coupled to the first signal terminal, a second terminal of the sixth transistor being coupled to the second output terminal, and a control terminal of the sixth transistor being coupled to the first clock signal terminal.

14. The gate drive circuit according to claim 8, wherein the reset module comprises:
- a seventh transistor, a first terminal of the seventh transistor being coupled to the first signal terminal, a second terminal of the seventh transistor being coupled to the first output terminal, and a control terminal of the seventh transistor being coupled to the reset signal terminal;
- an eighth transistor, a first terminal of the eighth transistor being coupled to the pull-up node, a second terminal of the eighth transistor being coupled to the first node, and a control terminal of the eighth transistor being coupled to the reset signal terminal; and
- a thirteenth transistor, a control terminal of the thirteenth transistor being coupled to the reset signal terminal, a first terminal of the thirteenth transistor being coupled to the first signal terminal, a second terminal of the thirteenth transistor being coupled to the first node.

15. The gate drive circuit according to claim 8, wherein the leakage-proof module comprises: a ninth transistor, a first terminal of the ninth transistor being coupled to the second signal terminal, a second terminal of the ninth transistor being coupled to the first node, and a control terminal of the ninth transistor being coupled to the pull-up node.

16. The gate drive circuit according to claim 10, wherein the noise reduction module comprises:
- a tenth transistor, a first terminal of the tenth transistor being coupled to the first signal terminal, a second terminal of the tenth transistor being coupled to the first node, and a control terminal of the tenth transistor being coupled to the first clock signal terminal;
- an eleventh transistor, a first terminal of the eleventh transistor being coupled to the first signal terminal, a second terminal of the eleventh transistor being coupled to the second output terminal, and a control terminal of the eleventh transistor being coupled to the third clock signal terminal; and
- a twelfth transistor, a first terminal of the twelfth transistor being coupled to the first node, a second terminal of the twelfth transistor being coupled to the pull-up node, and a control terminal of the twelfth transistor being coupled to the third clock signal terminal.

\* \* \* \* \*